US 7,466,394 B2

(12) United States Patent
Troost et al.

(10) Patent No.: US 7,466,394 B2
(45) Date of Patent: Dec. 16, 2008

(54) LITHOGRAPHIC APPARATUS AND DEVICE MANUFACTURING METHOD USING A COMPENSATION SCHEME FOR A PATTERNING ARRAY

(75) Inventors: Kars Zeger Troost, Waalre (NL); Johannes Jacobus Matheus Baselmans, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 110 days.

(21) Appl. No.: 11/312,638

(22) Filed: Dec. 21, 2005

(65) Prior Publication Data
US 2007/0139637 A1 Jun. 21, 2007

(51) Int. Cl.
G03B 27/54 (2006.01)
(52) U.S. Cl. .............................. 355/67; 355/71; 359/318
(58) Field of Classification Search .................... 355/53, 355/67, 71
See application file for complete search history.

(56) References Cited

U.S. PATENT DOCUMENTS

| | | | | |
|---|---|---|---|---|
| 4,993,824 A * | 2/1991 | Bluege | ........................ | 359/846 |
| 5,229,872 A | 7/1993 | Mumola | | |
| 5,296,891 A | 3/1994 | Vogt et al. | | |
| 5,500,736 A | 3/1996 | Koitabashi et al. | | |
| 5,523,193 A | 6/1996 | Nelson | | |
| 5,530,482 A | 6/1996 | Gove et al. | | |
| 5,579,147 A | 11/1996 | Mori et al. | | |
| 5,677,703 A | 10/1997 | Bhuva et al. | | |
| 5,808,797 A | 9/1998 | Bloom et al. | | |
| 5,982,553 A | 11/1999 | Bloom et al. | | |
| 6,133,986 A | 10/2000 | Johnson | | |
| 6,177,980 B1 | 1/2001 | Johnson | | |
| 6,473,237 B2 * | 10/2002 | Mei | ........................... | 355/67 |
| 6,687,041 B1 | 2/2004 | Sandstrom | | |
| 6,747,783 B1 | 6/2004 | Sandstrom | | |
| 6,795,169 B2 | 9/2004 | Tanaka et al. | | |
| 6,806,897 B2 | 10/2004 | Kataoka et al. | | |
| 6,811,953 B2 | 11/2004 | Hatada et al. | | |
| 7,106,490 B2 * | 9/2006 | Sandstrom | .................. | 359/290 |
| 2004/0041104 A1 | 3/2004 | Liebregts et al. | | |
| 2004/0130561 A1 | 7/2004 | Jain | | |
| 2005/0007572 A1 | 1/2005 | George et al. | | |

FOREIGN PATENT DOCUMENTS

WO   WO 98/33096   7/1998
WO   WO 98/38597   9/1998

OTHER PUBLICATIONS

U.S. Appl. No. 10/995,092, filed Nov. 24, 2004, Baba-Ali.
U.S. Appl. No. 11/018483, filed Dec. 22, 2004, Baba Ali et al.
U.S. Appl. No. 11/020,138, filed Dec. 27, 2004, Roux.

* cited by examiner

*Primary Examiner*—Della J. Rutledge
(74) *Attorney, Agent, or Firm*—Sterne, Kessler, Goldstein & Fox P.L.L.C.

(57) ABSTRACT

A lithographic apparatus comprising an array of individually controllable elements that modulates a beam of radiation and a projection system that projects the modulated beam onto the substrate. The individually controllable elements are provided with a compensation feature that is arranged to provide compensation radiation that substantially or at least partially cancels out unwanted radiation, such that the unwanted radiation is not projected by the projection system onto the substrate.

17 Claims, 5 Drawing Sheets

LITHOGRAPHIC APPARATUS AND DEVICE MANUFACTURING METHOD USING A COMPENSATION SCHEME FOR A PATTERNING ARRAY

BACKGROUND

1. Field of the Invention

The present invention relates to a lithographic apparatus and device manufacturing method.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (resist) provided on the substrate.

Instead of a circuit pattern, the patterning means can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Maskless lithography has in recent years been proposed as an alternative to mask-based lithography. In maskless lithography a patterning device comprising an array of individually controllable elements is used to modulate a beam of radiation which is then projected onto a substrate. The modulation of the beam can be changed by adjusting the positions or orientations of the individually controllable elements. It is desired when using maskless lithography to reduce the amount of unwanted stray scattered light in the beam projected onto the substrate.

What is needed is a lithographic apparatus and method that compensates for inconsistencies between individual programmable devices.

SUMMARY

In one embodiment of the present invention, there is provided a lithographic apparatus comprising an array of individually controllable elements that modulate a beam of radiation and a projection system that projects the modulated beam onto a substrate. The individually controllable elements are provided with a compensation feature. The compensation feature provides compensation radiation that substantially, or at least partially, cancels out unwanted radiation, such that the unwanted radiation is not projected by the projection system onto the substrate.

According to another embodiment of the present invention, there is provided an array of movable mirrors comprising a compensation feature. The compensation feature comprises a portion of each of the mirrors that is recessed or raised with respect to the remainder of the mirrors.

According to a further embodiment of the present invention, there is provided an array of movable mirrors comprising a compensation feature. The compensation feature comprises a step that extends transversely across the mirror.

According to still another embodiment of the present invention, there is provided a lithographic apparatus comprising an array of individually controllable elements that modulates a beam of radiation and a projection system that projects the modulated beam onto the substrate. The individually controllable elements are provided on a supporting substrate that is provided with a compensation feature arranged to provide compensation radiation which substantially or at least partially cancels out unwanted radiation reflected by the supporting substrate, such that it is not projected by the projection system onto the substrate.

According to yet another embodiment of the present invention, there is provided an array of movable mirrors provided on a supporting substrate, the supporting substrate being provided with a compensation feature comprising a step that extends transversely across the supporting substrate.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
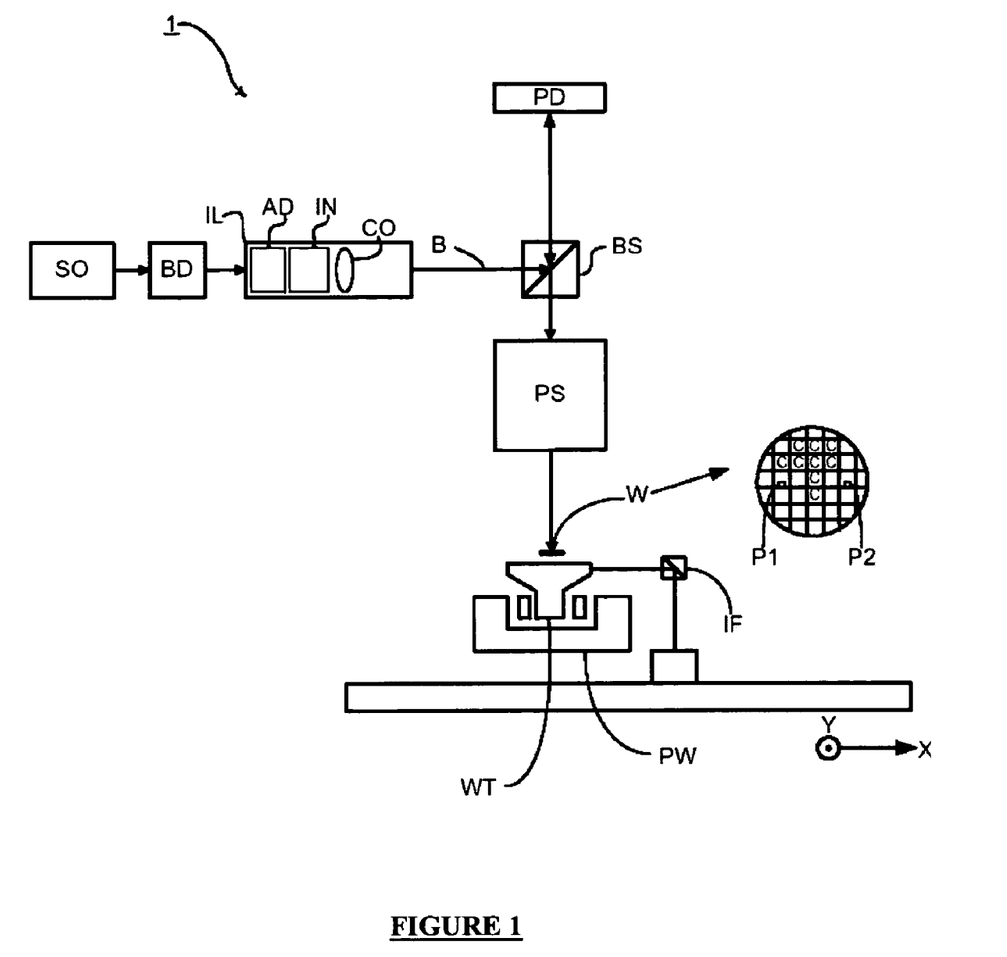
FIG. 1 depicts a lithographic apparatus, according to one embodiment of the present invention.

FIG. 1 schematically depicts the lithographic apparatus of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic patterning devices (e.g., arrays of programmable elements). For brevity, most of the description will be in terms of a dynamic patterning device, however it is to be appreciated that a static patterning device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

Examples where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 μm, e.g., at least 100 μm, at least 200 μm, at least 300 μm, at least 400 μm, at least 500 μm, or at least 600 μm. In one example, the thickness of the substrate is at most 5000 μm, e.g., at most 3500 μm, at most 2500 μm, at most 1750 μm, at most 1250 μm, at most 1000 μm, at most 800 μm, at most 600 μm, at most 500 μm, at most 400 μm, or at most 300 μm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

As herein depicted in FIG. 1, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 275 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In one example, the apparatus is absent at least a short stroke module for moving substrate table WT. A similar system can also be used to position the array of individually controllable elements. It will be appreciated that the beam B can alternatively/additionally be movable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In an embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

Figure 2:
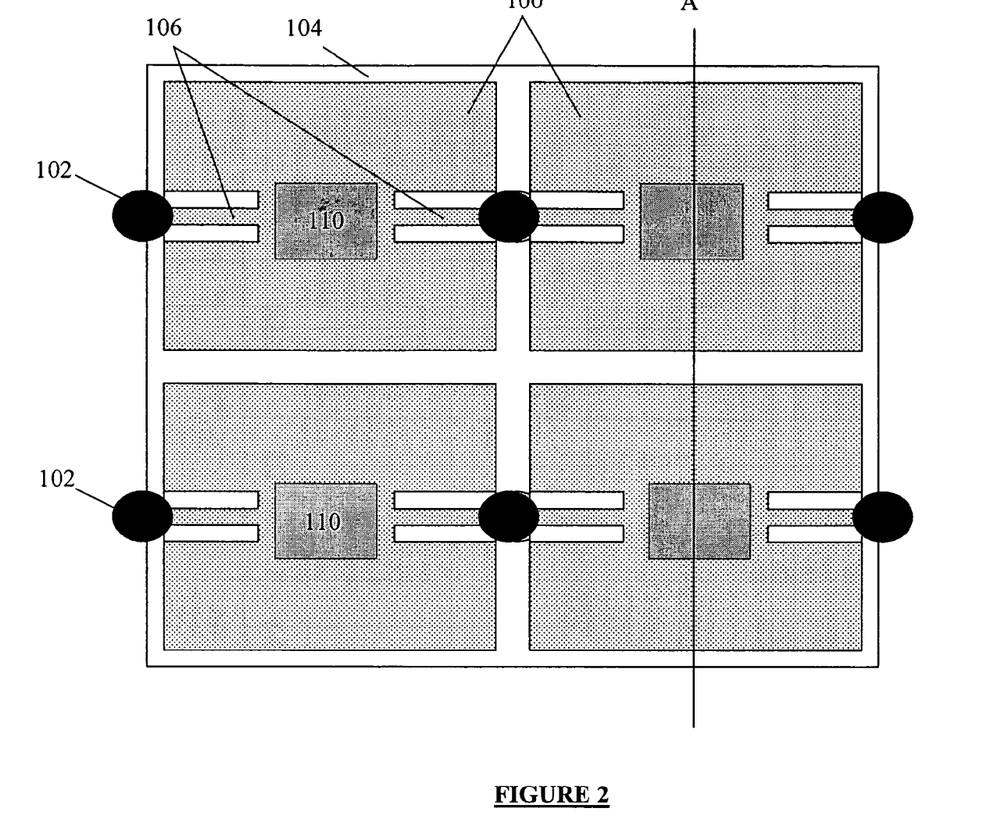
FIGS. 2 and 3A-C depict mirrors of a maskless lithographic apparatus, according to various embodiments of the present invention.

FIG. 2 illustrates schematically four mirrors 100, which form part of the patterning device PD of FIG. 1, according to one embodiment of the present invention. The mirrors 100 are connected to posts 102 that extend from a supporting substrate 104. The mirrors 100 are attached to the posts 102 via connectors 106. Although four mirrors 100 are shown in FIG. 2, it will be appreciated that the patterning device can include many more mirrors. For example, it can include at least 100, at least 1000, at least 10000, at least 100000, at least 1000000, or at least 10000000 programmable elements.

Figure 3A:
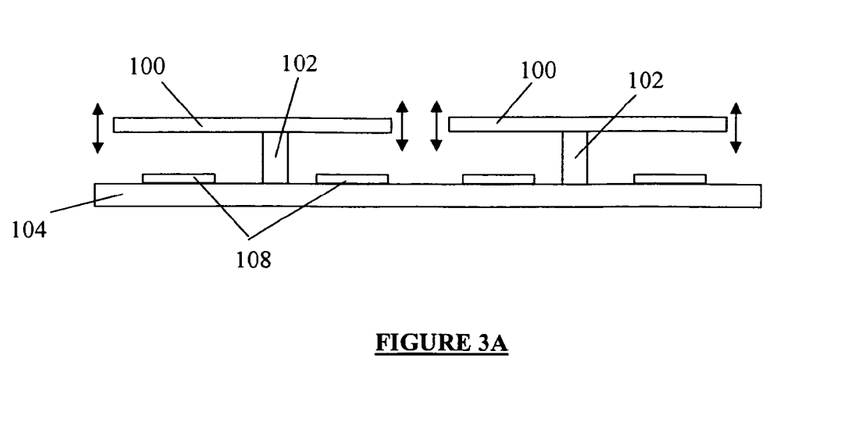

FIG. 3A shows a cross-sectional view of the mirrors 100 along line A of FIG. 2. The mirrors 100 are rotatably mounted on the posts 102, and their positions are controlled by applying charge to capacitor plates 108 provided on the supporting substrate 104. The mirrors are thus programmable, and can be considered to be programmable elements (see further above).

The mirrors 100 and associated components are fabricated as MEMS devices using, for example, lithographic techniques. The mirrors can be formed from different materials deposited via standard vapor-based, including plasma-enhanced, deposition methods (including sputtering and evaporation). Materials that can be used to form the mirrors include metals (e.g., Al with additions to improve the mechanical behavior), Cu, Ti, etc. and nano-crystalline and single-crystalline semiconductors such as Si, SiGe, silicon carbite or crystalline silicon. The mirrors can be provided with a reflective coating of for example Al, Ag, Au or dielectric coating stacks optimized for wavelength and reflection angle. The connectors 106 are formed from the same material as the mirrors 100. The connectors 106 are resiliently flexible, with the result that when a charge is applied to a capacitor plate 108 it causes the mirror 100 to rotate away from its default position (this is horizontal in FIG. 3A), and when the charge is removed from the capacitor plate the mirror 100 returns to its equilibrium position.

In use, a beam of radiation is directed at the mirrors 100, and passes via a projection system to a substrate W (see, for example, FIG. 1). The angular orientation of a given mirror 100 determines the amount of radiation that is incident upon the substrate W. Different levels of intensity of radiation can be provided at the substrate W by positioning the mirror 100 at different orientations. This is referred to as grayscaling (see above).

Figure 4:
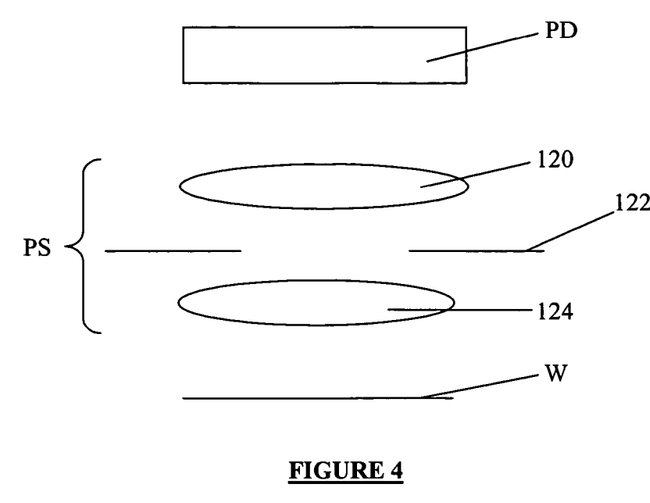
FIG. 4 depicts part of a maskless lithographic apparatus, according to one embodiment of the present invention.

FIG. 4 shows schematically a patterning device PD, projection system PS and substrate W, according to one embodiment of the present invention. In one example, these elements can be considered to be equivalent to those shown in FIG. 1. The projection system PS comprises a first lens group 120, an aperture 122 and a second lens group 124. To simplify understanding, for the purposes of this part of the description, the patterning device PD can be assumed to be a single mirror.

Figure 5A:
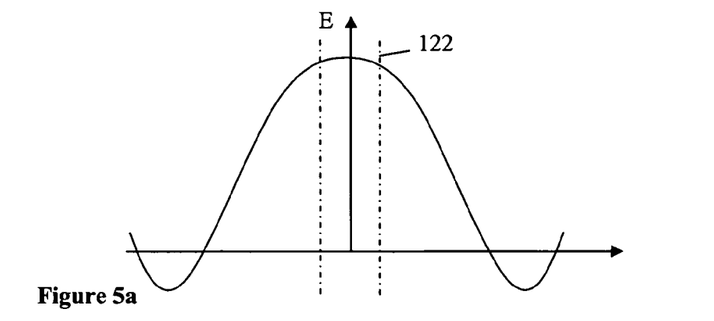
FIG. 5 depicts an operation of a maskless lithographic apparatus, according to one embodiment of the present invention.

FIG. 5a shows schematically the E-field amplitude of radiation. The fraction between the dotted lines (defined by the aperture 122) is transmitted when the mirror of the patterning device PD is in a horizontal orientation. The aperture 122 cuts away a substantial portion of the radiation, but allows the highest amplitude portion of the radiation to pass. That radiation is then directed by the second lens group 124 onto the substrate W.

Figure 5B:
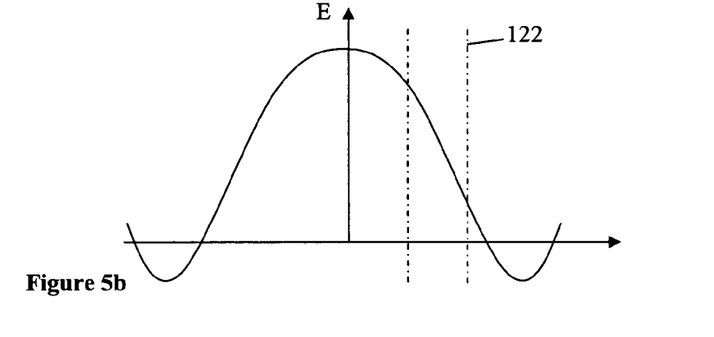

FIG. 5b illustrates the situation when the mirror of the patterning device PD has been rotated. The radiation is shifted relative to the aperture 122, with the effect that the aperture allows only a small subset of the E-field amplitude to be transmitted to the substrate W.

Figure 5C:
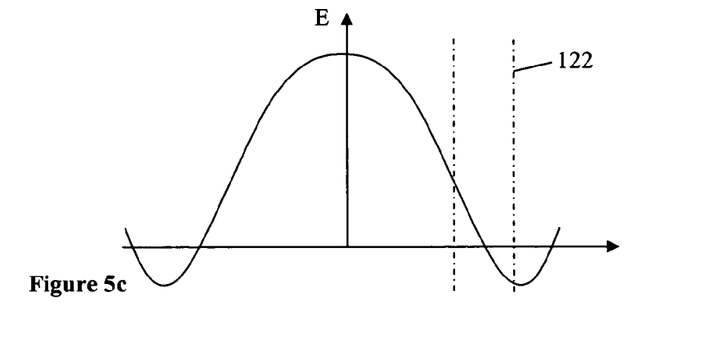

Referring to FIG. 5c, if the mirror of the patterning device is rotated still further, then the E-field amplitude of the radiation which passes through the aperture 122 is in part positive and in part negative. This results in a net zero E-field amplitude, and thus zero intensity of radiation, at the substrate W.

Figure 5D:
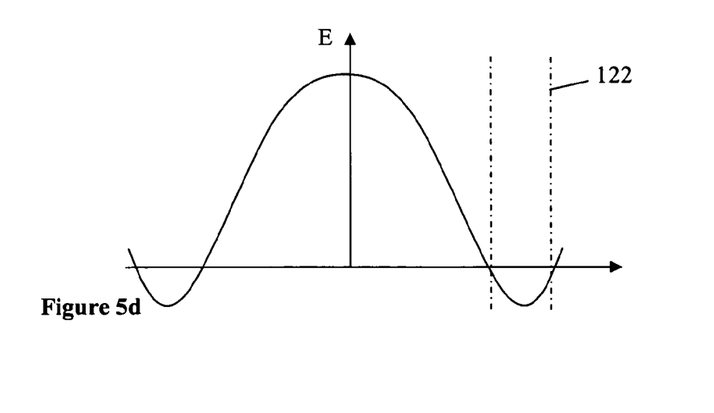

Referring to FIG. 5d, if the mirror were to be rotated still further, then this would result in radiation of entirely negative E-field amplitude passing to the substrate W. At first sight this can appear not to be important, in the sense that radiation will still be seen at the substrate W (the intensity of the radiation is the square of the E-field amplitude). However, the interference of this negative amplitude radiation with, for example, radiation provided from an adjacent mirror to an adjacent location on the substrate W allows desired effects to be achieved (for example, sharpening the edge of a pixel projected onto the substrate).

Being able to operate each mirror of the patterning device as described above in relation to FIGS. 4 and 5 is desirable, because it allows accurate control of patterns formed at the substrate W using the mirrors 100. However, radiation is scattered from the posts 102 and connectors 106 of the mirrors 100. Radiation can also be scattered from edges of the mirrors 100. Because the mirrors are provided in a two-dimensional array with a regular periodicity, this scattering manifests itself as diffracted radiation, which can be unwanted radiation. Where this unwanted diffracted radiation is transmitted onto the substrate W it can reduce the contrast that can be achieved using the mirrors 100. In the context of FIG. 5, the unwanted diffracted radiation causes an upward (or downward) shift of the radiation amplitude. The unwanted diffracted radiation can reduce the amount of negative amplitude radiation, for example if the unwanted diffraction radiation is in phase (0 degree phase difference) or out of phase (180 degree phase difference) with the radiation reflected by the mirrors. This can mean that it is not possible to project a net zero intensity of radiation onto the substrate W, or to project a sufficient amount of negative amplitude radiation to provide useful interference with radiation reflected from neighboring mirrors.

In most cases, the unwanted reflected light is not in phase or out of phase with the wanted reflected light (from the mirrors). In this case not only is the mirror contrast reduced (as described above), but also additional imaging defects are observed. One additional imaging defect that can be observed is asymmetric imaging through focus.

The effect of the aperture 122 in this embodiment of the present invention is to allow only one diffraction order to be transmitted to the substrate W. This means that the combined scattering effects of the posts 102, connectors 106 and mirror edges are combined to a single diffraction order with a specific amplitude.

According to one embodiment of the invention, the mirrors 100 are modified such that they generate radiation with a substantially equal amplitude, but opposite phase to pass through the aperture 122, thereby substantially canceling out the unwanted diffracted radiation. Canceling out the unwanted diffracted radiation increases the contrast that can be achieved using the mirrors 100 and improves the imaging.

FIG. 2 shows schematically one embodiment of the present invention, wherein each mirror 100 is provided with a compensation feature comprising a compensating portion 110, which is recessed into the mirror surface. The compensating portion has a depth that can, for example, be $\lambda/4$, such that radiation that is incident upon the compensating portion undergoes a phase change of $\pi/2$ as compared to radiation that is reflected from other areas of the mirror 100. The size and depth of the compensating portion 110 can be selected such that it provides radiation within a given diffraction order that has substantially the same amplitude, but opposite phase, to the unwanted identical diffraction order generated by mirrors. The radiation provided by the compensating portion 110 therefore substantially cancels out the unwanted diffracted radiation, such that the net unwanted diffracted radiation passing through the aperture 122 to the substrate W is substantially zero. It will be appreciated that the depth of the compensating portion 110 may not be $\lambda/4$, but can be some other depth (this is dependent upon the phase of the unwanted diffracted radiation generated by the posts 102, connectors 106 and mirror edges).

Figure 6:
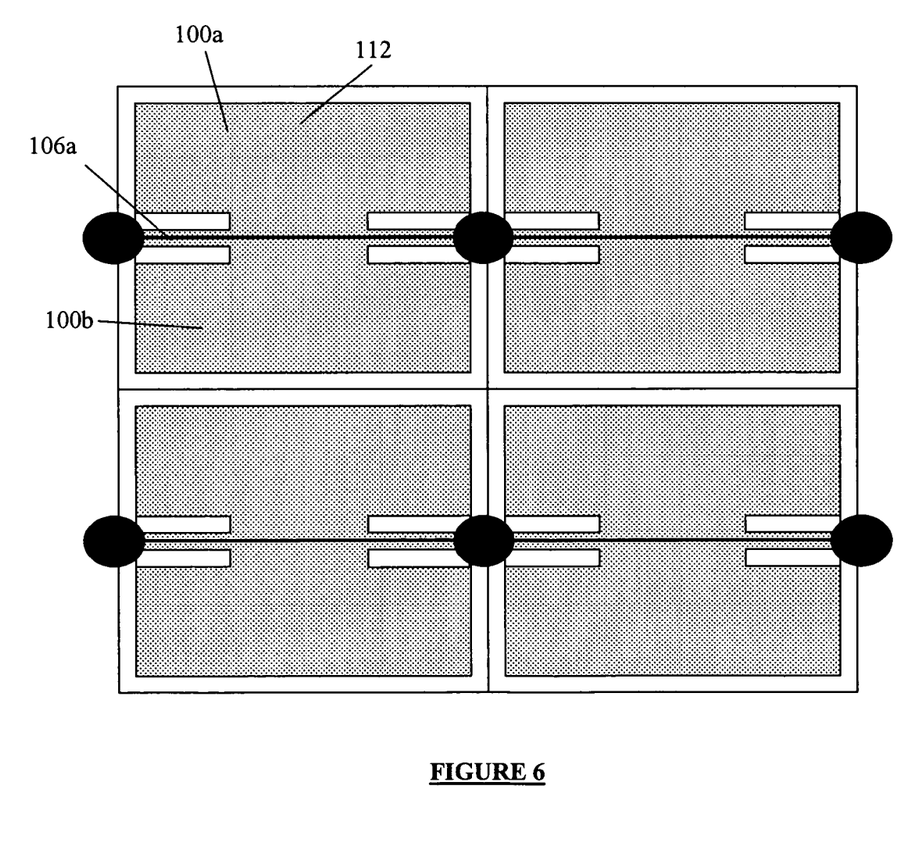
FIG. 6 depicts alternative mirrors of a maskless lithographic apparatus, according to one embodiment of the present invention.

An alternative embodiment of the present invention is shown schematically in FIG. 6. In this embodiment, where each mirror 100 is provided with a compensation feature that comprises a step 112 that extends across the mirror parallel to the axis of rotation of the mirror. The step has a depth of $\lambda/4$, and the top side 100a of each mirror 100 has a surface that is recessed by $\lambda/4$ with respect to the bottom side 100b of that mirror. The phase step 112 is desirable because it has the effect of providing unwanted diffracted radiation that is of a substantially equal amplitude, but opposite phase, from the top side of each mirror 100a than from the bottom side of each mirror 100b, thereby canceling out this unwanted radiation. It will be appreciated that some useful compensation can be obtained even if the step does not exactly bisect the mirror 100.

Figures 3B, 3C:
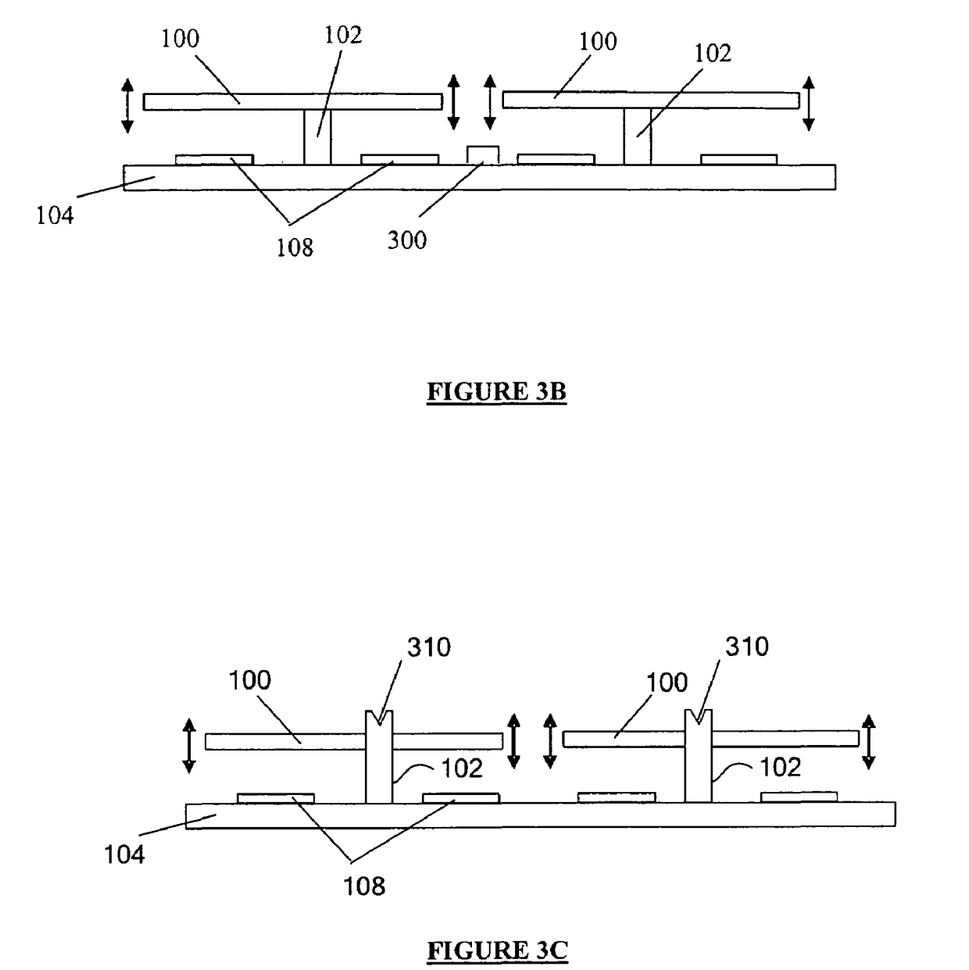

In addition to providing compensation for diffracted scattered radiation that arises from the posts 102, connectors 106 and mirror edges, it can be desired to arrange the supporting substrate 104 such that radiation that is scattered from the supporting substrate 104 substantially cancels out. As shown in FIG. 3B, although the supporting substrate 104 is not intended to reflect radiation that is subsequently incident upon a substrate W, some reflection can occur and this is why it is preferred that this radiation be substantially cancelled out by using a compensation feature 300. This can be done for example by providing a step of the type described above in relation to FIG. 6. The location and/or phase of the step can be adjusted to take account of asymmetries on the supporting substrate 104, for example the presence of wires or other features.

Alternatively, the compensating portion 110 shown in FIG. 2 can be replaced, for example, by compensating portions which are located away from the axis of rotation of the mirror 100. Where this is done, the compensating portions should be provided in a configuration that is symmetric about the axis of rotation, for example a compensating portion at either end of the mirror (i.e., spaced away from the axis of rotation). A configuration of this type will reduce the amount of useful reflecting area of the mirrors 100. By contrast, the compensating portion shown in FIG. 2 does not have a significant impact on useful reflecting area of the mirror 100, since it is located on the axis of rotation of the mirror. This region of the mirror does not contribute significantly towards useful radiation directed towards the substrate W.

Alternatively, the compensating portion 110 shown in FIG. 2 can be replaced, for example, by an array of recessed and/or raised portions. These can for example be provided in the form of an array of tiles on the mirror. An array of recessed and raised portions can be configured such that they cancel out unwanted diffracted light.

The posts 102 can reflect a small portion of radiation from their upper surfaces. As shown in FIG. 3C, the posts can be provided with a v-shape 310 at their upper ends, as this provides good inherent compensation (different phases of radiation will be generated which will tend to cancel out with one another).

Alternatively, one or more of the above embodiments of the invention can be arranged to include compensation for unwanted diffracted light generated from the posts 102. The embodiments of the invention can be applied to the posts themselves. For example, each post can be provided with a $\lambda/4$ step, which can bisect an upper surface of the post. This will have the effect of canceling out unwanted diffracted light generated from the posts.

The above described embodiments of the invention refer to providing compensating radiation that substantially cancels out unwanted diffracted radiation. In some instances it may not be possible to substantially cancel out the unwanted diffracted radiation. Where this is the case, the invention can still usefully partially cancel out (in other words, reduce) the unwanted diffracted radiation.

Although the described embodiments of the present invention relate to an array of movable mirrors, the invention can be applied to other arrays of individually controllable elements, for example to an array of diffractive optical MEMS devices. This can be achieved for example by having a $\lambda/4$ phase step and/or having dedicated compensating areas.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diode (LEDs), etc. Also, for instance in a flat panel display, the present apparatus can be used to assist in the creation of a variety of layers, e.g. a thin film transistor layer and/or a color filter layer.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic apparatus, comprising:
   an array of individually controllable elements that modulates a beam of radiation; and
   a projection system that projects the modulated beam onto a substrate,
   wherein the individually controllable elements are provided with a compensation feature that is shaped to provide compensation radiation within a given diffraction order that has substantially a same amplitude, but opposite phase, to diffracted radiation to substantially cancel out the diffracted radiation, such that the diffracted radiation is not projected by the projection system onto the substrate.

2. The apparatus of claim 1, wherein the array of individually controllable elements comprises an array of movable mirrors.

3. The apparatus of claim 2, wherein the compensation feature comprises a portion of the mirror that is recessed or raised with respect to the remainder of the mirror, such that radiation reflected from the portion has a phase that is different from radiation reflected from the remainder of the mirror.

4. The apparatus of claim 3, wherein a depth or height of the compensation feature, as compared with the remainder of the surface of the mirror, is one quarter of a wavelength of the beam of radiation.

5. The apparatus of claim 2, wherein a mirror in the array of mirrors has the compensation feature which comprises a step that extends across the mirror in a direction that is parallel to an axis of rotation of the mirror.

6. The apparatus of claim 5, wherein the step has a depth of one quarter of a wavelength of the beam of radiation.

7. The apparatus of claim 5, wherein the step bisects the axis of rotation of the mirror.

8. The apparatus of claim 2, wherein:
   the movable mirrors are connected to posts; and
   a compensation feature is provided on at least one of the posts.

9. The apparatus of claim 8, wherein the compensation feature comprises a step provided on at least one of the posts.

10. The apparatus of claim 1, wherein a size of the compensation feature is configured to perform the substantial or at least partial canceling out of the diffracted radiation.

11. The apparatus of claim 1, wherein an individually controllable element in the array of individually controllable elements is a mirror and the compensation feature is symmetric about a rotational axis of the mirror.

12. The apparatus of claim 1, wherein an individually controllable element in the array of individually controllable elements is a mirror and the compensation feature is located on, and extends to either side of, a rotational axis of the mirror.

13. The apparatus of claim 1, wherein the compensation feature comprises an array of raised and/or recessed portions.

14. An array of movable mirrors comprising:
a compensation feature that is shaped to provide compensation radiation within a given diffraction order that has substantially a same amplitude, but opposite phase, to diffracted radiation to substantially cancel out the diffracted radiation, the compensation feature comprising a portion of each of the mirrors that is recessed or raised with respect to a remainder of the mirror in the array of movable mirrors.

15. An array of movable mirrors, comprising:
a compensation feature that is shaped to provide compensation radiation within a given diffraction order that has substantially a same amplitude, but opposite phase, to diffracted radiation to substantially cancel out the diffracted radiation, the compensation feature comprising a step which extends transversely across each mirror in the array of movable mirrors.

16. A lithographic apparatus, comprising:
a supporting substrate that comprises a compensation feature;
an array of individually controllable elements that are coupled to the supporting substrate and that modulate a beam of radiation; and
a projection system that projects the modulated beam onto a substrate,
wherein the compensation feature provides compensation radiation that substantially or at least partially cancels out radiation reflected by the supporting substrate, such that the radiation reflected by the supporting substrate is not projected by the projection system onto the substrate.

17. A system, comprising:
a supporting substrate; and
an array of movable mirrors provided on the supporting substrate, the supporting substrate being provided with a compensation feature comprising a step that extends transversely across the supporting substrate.

* * * * *